United States Patent
Okubo et al.

(10) Patent No.: US 7,427,895 B1
(45) Date of Patent: Sep. 23, 2008

(54) DOHERTY AMPLIFIER WITH IMPROVED LINEARITY

(75) Inventors: Yoichi Okubo, Tokorozawa (JP); Yasuhiro Takeda, Kodaira (JP); Manabu Nakamura, Akishima (JP); Naoki Hongo, Ome (JP); Masaru Adachi, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 120 days.

(21) Appl. No.: 11/581,418

(22) Filed: Oct. 17, 2006

(30) Foreign Application Priority Data

Oct. 18, 2005  (JP) ............................. 2005-303093

(51) Int. Cl.
  *H03F 3/68* (2006.01)
(52) U.S. Cl. ................................. 330/124 R; 330/136
(58) Field of Classification Search ............. 330/124 R, 330/136
  See application file for complete search history.

(56) References Cited

U.S. PATENT DOCUMENTS 6,639,464 B2 * 10/2003 Hellberg ................. 330/124 R 6,853,244 B2 * 2/2005 Robinson et al. ............... 330/51

FOREIGN PATENT DOCUMENTS

| JP | 2004-96729  | 3/2004 |
| JP | 2004-173231 | 6/2004 |
| JP | 2005-516524 | 6/2005 |

OTHER PUBLICATIONS

T. J. Jeong, T. H. Kim, I. S. Chang and C. D. Kim, "A Doherty Amplifier with a Bias Adaptation Technique Based on SDR Transmitter Architecture", *Microwave Journal*, V. 48:9 (2005), pp. 140-158.

* cited by examiner

*Primary Examiner*—Steven J Mottola
(74) *Attorney, Agent, or Firm*—Bacon & Thomas, PLLC.

(57) ABSTRACT

A first control unit controls a bias applied to the peak amplifier to (a) make a peak amplifier operate as class C when the level of the input signal is lower than a first threshold value, to (b) make the peak amplifier operate as class AB with a second conduction angle substantially equal to a first conduction angle, when the level of the input signal is higher than a second threshold value higher than the first threshold value, and to (c) make the peak amplifier operate as class AB with a third conduction angle smaller than the first conduction angle, when the level of the input signal is not less than the first threshold value and not more than the second threshold value.

13 Claims, 10 Drawing Sheets

DOHERTY AMPLIFIER WITH IMPROVED LINEARITY

CROSS-REFERENCE TO RELATED APPLICATIONS

This application is based upon and claims the benefit of priority from prior Japanese Patent Application No. 2005-303093, filed Oct. 18, 2005, the entire contents of which are incorporated herein by reference.

BACKGROUND OF THE INVENTION

1. Field of the Invention

The present invention relates to a linearity-improved Doherty amplifier apparatus.

2. Description of the Related Art

In conventional common amplifiers for amplifying the power of a radio frequency signal, such as a code division multiple access (CDMA) signal or multi-carrier signal, the operation range is widened to the region near the saturation region, using a distortion compensator, thereby reducing the power consumption. There are limits to reducing the power consumption of the common amplifier only using a feedforward distortion compensator or pre-distortion compensator. In recent years, attention has been paid to Doherty amplifiers as highly efficient amplifiers.

Figure 1:
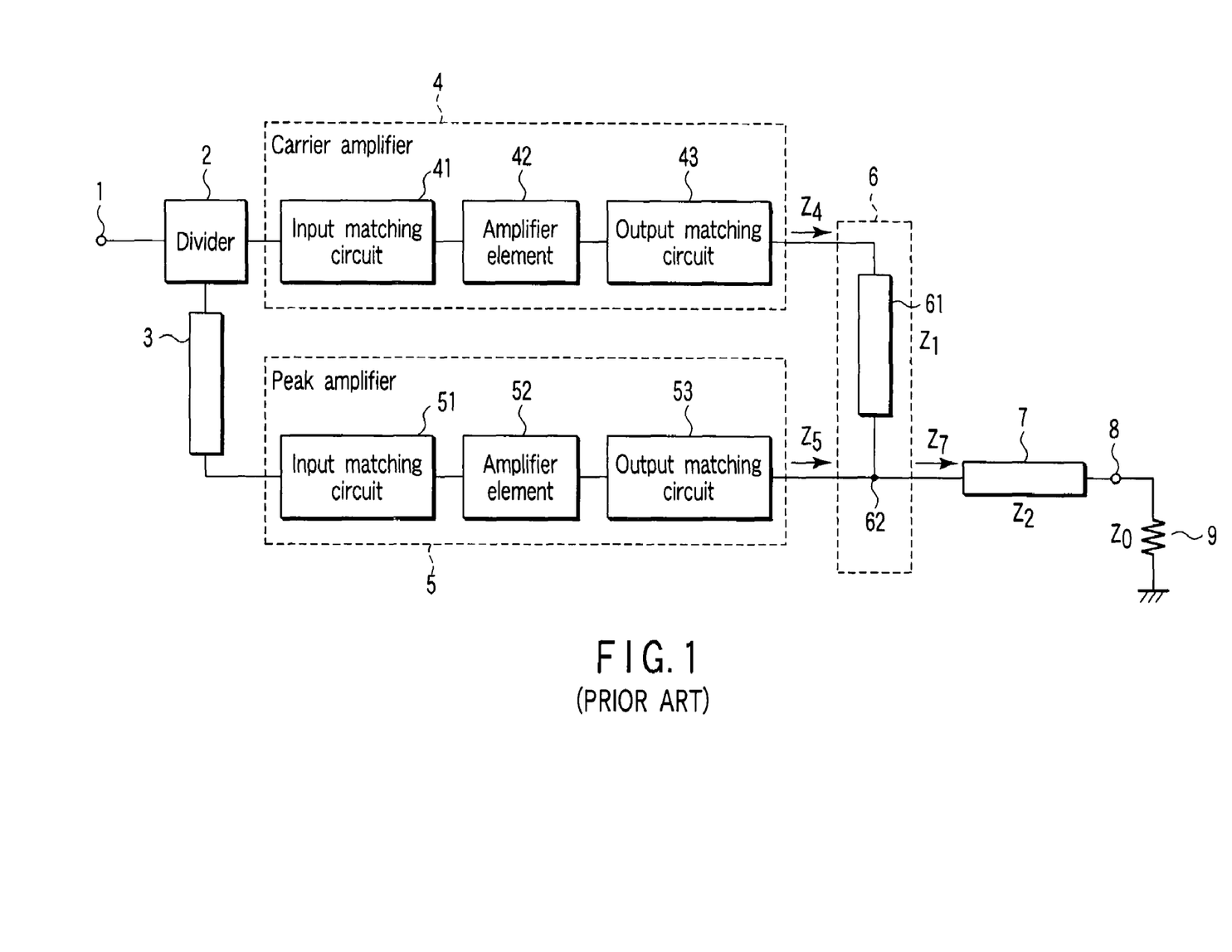
FIG. 1 is a block diagram illustrating a conventional Doherty amplifier.

In a conventional Doherty amplifier as shown in FIG. 1, an input signal from an input terminal 1 is divided into two signals by a divider 2. One of the resultant signals is input to a carrier amplifier 4. The signal output from the carrier amplifier 4 is guided to a node 62 via a λ/4 transformer 61 for impedance transformation.

The other signal output from the divider 2 is supplied to a phase shifter 3, where the phase of the signal is shifted by 90°. The resultant signal is input to a peak amplifier 5, which, in turn, outputs a signal to the node 62.

The output signals of the carrier amplifier 4 and peak amplifier 5 are combined by a Doherty synthesis unit 6 formed of the λ/4 transformer 61 and node 62. The resultant signal is output to an output terminal 8 via a λ/4 transformer 7 for impedance transformation. The output terminal is connected to a load 9.

An amplifier element 42 incorporated in the carrier amplifier 4 is biased as class AB, while an amplifier element 52 incorporated in the peak amplifier 5 is biased as class B or C. The amplifier element 42 operates singly until the input signal reaches a certain level at which the peak amplifier 5 operates. When the amplifier element 42 enters its saturation region and its linearity starts to deteriorate, the amplifier element 52 starts to operate. At this time, the output signal of the peak amplifier 5 is input to the load 9, whereby the peak amplifier 5 drives the load 9 along with the carrier amplifier 4. Further, at this time, the load line of an output matching circuit 43 shifts from a higher impedance to a lower impedance. However, since the amplifier element 42 is in its saturation region, the Doherty amplifier exhibits high efficiency. When the level of the input signal is further increased, the amplifier element 52 also enters its saturation region. At this time, since both the amplifier elements 42 and 52 are saturated, the Doherty amplifier exhibits high efficiency.

Figure 2:
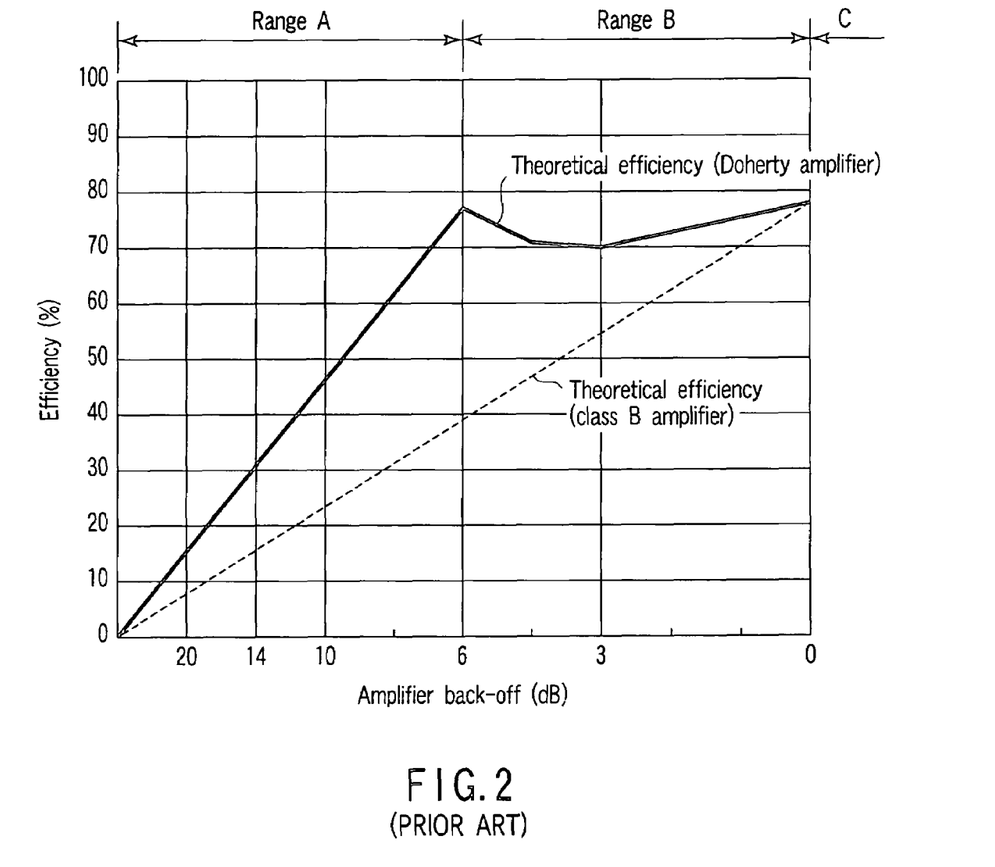
FIG. 2 is a graph illustrating the theoretical collector or drain efficiency of the Doherty amplifier shown in FIG. 1.

FIG. 2 illustrates the theoretical collector or drain efficiency of the Doherty amplifier shown in FIG. 1, and the efficiency of a general class B amplifier. The collector efficiency is defined as the ratio of the radio frequency output power output from the collector of an amplifier transistor to the product of a DC voltage applied by a power supply to the collector and a DC current supplied from the power supply. The drain efficiency is also defined in that way. The horizontal axis of FIG. 2 indicates the amplifier back-off, i.e., the dB ratio between a compression point of 0 dB and the input level of the amplifier. The compression point is defined as the minimum input signal level at which the amplifier elements 42 and 52 are saturated.

When the input signal level is in range A, only the carrier amplifier 4 operates, in general. When the amplifier back-off reaches about 6 dB, the carrier amplifier 4 starts to be saturated, and the efficiency of the Doherty amplifier reaches about the maximum efficiency of the class B amplifier. At this time, the output power of the carrier amplifier 4 is about $P_0/4$, assuming that the maximum output power of the Doherty amplifier is $P_0$.

When the input signal level is in range B, the output of the carrier amplifier 4 increases from about $P_0/4$ to about $P_0/2$ and that of the peak amplifier 5 increases from about 0 to $P_0/2$, as the input signal level increases. At this time, the sum of the outputs of the carrier and peak amplifiers 4 and 5 increases in accordance with an increase in the power input to the input terminal 1, with the same proportionality constant as in range A. Although the efficiency once decreases when the peak amplifier 5 starts to operate, it again assumes the peak value at the compression point at which the peak amplifier 5 also starts to be saturated. At the compression point, the output of the carrier amplifier 4 is substantially equal to that of the peak amplifier 5.

In general, the CDMA signal or multi-carrier signal has a high peak factor (the ratio of the peak power to the average power) is high. Accordingly, in general amplifiers, to be compatible a peak factor of 7 to 12 dB, the point acquired by subtracting the peak factor of 7 to 12 dB from the compression point is used as their operating point.

A description will now be given of impedance transformation performed in the λ/4 transformers 7 and 61. Since the impedance of output load $Z_0$ is set constant, it is used as a start point. Assuming that the characteristic impedance of the λ/4 transformer 7 is $Z_2$, impedance $Z_7$ of the λ/4 transformer 7 seen from the node 62 is given by $$Z_7 = Z_2^2/Z_0$$

Impedance $Z_4$ of the λ/4 transformer 61 seen from the output matching circuit 43 is given in the same manner as impedance $Z_7$, since the output impedance of an output matching circuit 53 is substantially infinite in range A. In range C, since the output matching circuits 43 and 53 bear the same load, the load impedance of the λ/4 transformer 61 (i.e., the contributory share of the carrier amplifier 4 at the node 62) and the load impedance of the output matching circuit 53 are both $2Z_7$, and the following equations are given:

$$Z_4 = \begin{cases} \dfrac{Z_1^2}{Z_7} = \dfrac{Z_1^2}{(Z_2^2/Z_0)} = Z_0 \dfrac{Z_1^2}{Z_2^2} & (\text{range } A) \\ \dfrac{Z_1^2}{2Z_7} = (1/2)Z_0 \dfrac{Z_1^2}{Z_2^2} & (\text{range } C) \end{cases}$$

$$Z_5 = \begin{cases} \infty & (\text{range } A) \\ 2Z_7 & (\text{range } C) \end{cases}$$

where impedance $Z_1$ is the characteristic impedance of the λ/4 transformer 61. In range B, impedances $Z_4$ and $Z_5$ shift between the values in range A and the values in range C.

If the conventional Doherty amplifier using the semiconductor amplifier element 42 is used for a high-frequency band, it is difficult to make the impedance seen from the amplifier element 42 coincide with that according to the Doherty theory. This is because the load line seen from the amplifier element 42 is varied by the behavior of the output matching circuit 43.

On the other hand, PCT National Publication No. P2005-516524A, HYEONR TAE JEONG; TAE HO KIM; IK SOO CHANG; CHUL DONG KIM; "A doherty amplifier with a bias adaptation technique based on SDR transmitter architecture", Microwave journal, Vol. 48, No. 9, 2005, pp. 140-158, JP-A 2004-173231 (KOKAI) and JP-A 2004-96729 (KOKAI) disclose improved Doherty amplifiers, in which the bias applied to the peak amplifier is controlled to keep the amplifier element off in the low-power mode, and to operate it as class AB in the high-power mode.

Figure 3:
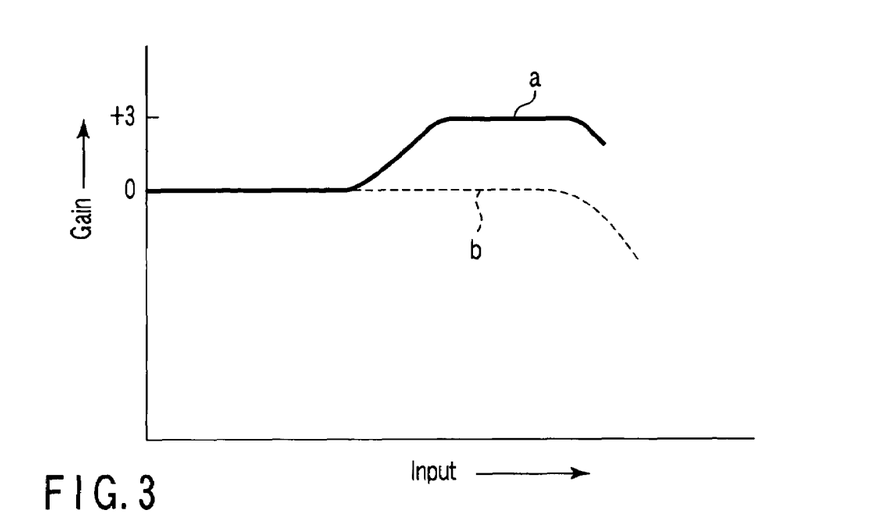
FIG. 3 is a graph useful in explaining the AM-AM characteristic of a conventional Doherty amplifier with a bias control function.

However, it is assumed that these improved Doherty amplifiers exhibit the AM-AM characteristic shown in FIG. 3. In FIG. 3, solid line a indicates the characteristic of a Doherty amplifier having a bias control function, and broken line b indicates the characteristic of a general Doherty amplifier having no bias control function. In the case of the Doherty amplifier with the bias control function, in the region in which the input signal level is low and the peak amplifier does not operate, a loss of 3 dB occurs because of the divider. In contrast, in the region in which the input signal level is high and the peak amplifier operates as class AB, the output power of the standard class AB amplifier is synthesized without any distribution loss, whereby the gain of the Doherty amplifier is increased by 3 dB. Accordingly, it is considered that the conventional Doherty amplifier with bias control exhibits a degraded AM-AM characteristic. Actually, however, a gain increase of as much as 3 dB cannot be expected since the load of the carrier amplifier varies. For facilitating the description, the gain increase is tentatively set to 3 dB.

As described above, where the conventional Doherty amplifier shown in FIG. 1 is used for a high-frequency band, utilizing a semiconductor amplifier element, it is difficult to make the impedance seen from the amplifier element coincide with that according to the Doherty theory. Furthermore, if the conventional Doherty amplifier is improved into such a highly efficient amplifier as disclosed in JP-A 2004-173231 (KOKAI) and JP-A 2004-96729, an extremely highly efficient amplifier can be acquired. In this case, however, the distortion characteristic is inevitably degraded.

BRIEF SUMMARY OF THE INVENTION

It is an object of the invention to provide a highly efficient amplifier apparatus of low distortion and excellent linearity.

According to a first aspect of the present invention, there is provided an amplifier apparatus comprising: an input terminal to receive an input signal to be amplified; a divider to divide the input signal into a first divided signal and a second divided signal; a carrier amplifier to amplify the first divided signal by operating as a class AB with a first conduction angle and produce a first amplified signal; a variable attenuator to attenuate the second divided signal in accordance with a variable attenuation amount; a peak amplifier to amplify the second divided signal attenuated by the variable attenuator to produce a second amplified signal; a first control unit configured to control a bias applied to the peak amplifier to (a) make the peak amplifier operate as a class C when a level of the input signal is lower than a first threshold value, to (b) make the peak amplifier operate as the class AB with a second conduction angle substantially equal to the first conduction angle, when the level of the input signal is higher than a second threshold value higher than the first threshold value, and to (c) make the peak amplifier operate as the class AB with a third conduction angle smaller than the first conduction angle, when the level of the input signal is not less than the first threshold value and not more than the second threshold value; a second control unit configured to control for increasing the attenuation amount in accordance with an increase in the level of the input signal; a combiner to combine the first amplified signal and the second amplified signal and produce an amplified output signal; and a signal output terminal to output the amplified output signal.

According to a second aspect of the present invention, there is provided an amplifier apparatus comprising: an input terminal to receive an input signal to be amplified; a variable attenuator to attenuate the input signal in accordance with a variable attenuation amount; a preamplifier to amplify the input signal attenuated by the variable attenuator by operation as a class AB; a divider to divide the attenuated input signal into a first divided signal and a second divided signal; a carrier amplifier to amplify the first divided signal by operating as the class AB with a first conduction angle and produce a first amplified signal; a peak amplifier to amplify the second divided signal attenuated by the variable attenuator and produce a second amplified signal; a first control unit configured to control a bias applied to the peak amplifier to (a) make the peak amplifier operate as a class C when a level of the input signal is lower than a first threshold value, to (b) make the peak amplifier operate as the class AB with a second conduction angle substantially equal to the first conduction angle, when the level of the input signal is higher than a second threshold value higher than the first threshold value, and to (c) make the peak amplifier operate as the class AB with a third conduction angle smaller than the first conduction angle, when the level of the input signal is not less than the first threshold value and not more than the second threshold value; a second control unit configured to control for increasing the attenuation amount in accordance with an increase in the level of the input signal; a combiner to combine the first amplified signal and the second amplified signal and produce an amplified output signal; and a signal output terminal to output the amplified output signal.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the invention will be described with reference to the accompanying drawings.

First Embodiment

Figure 4:
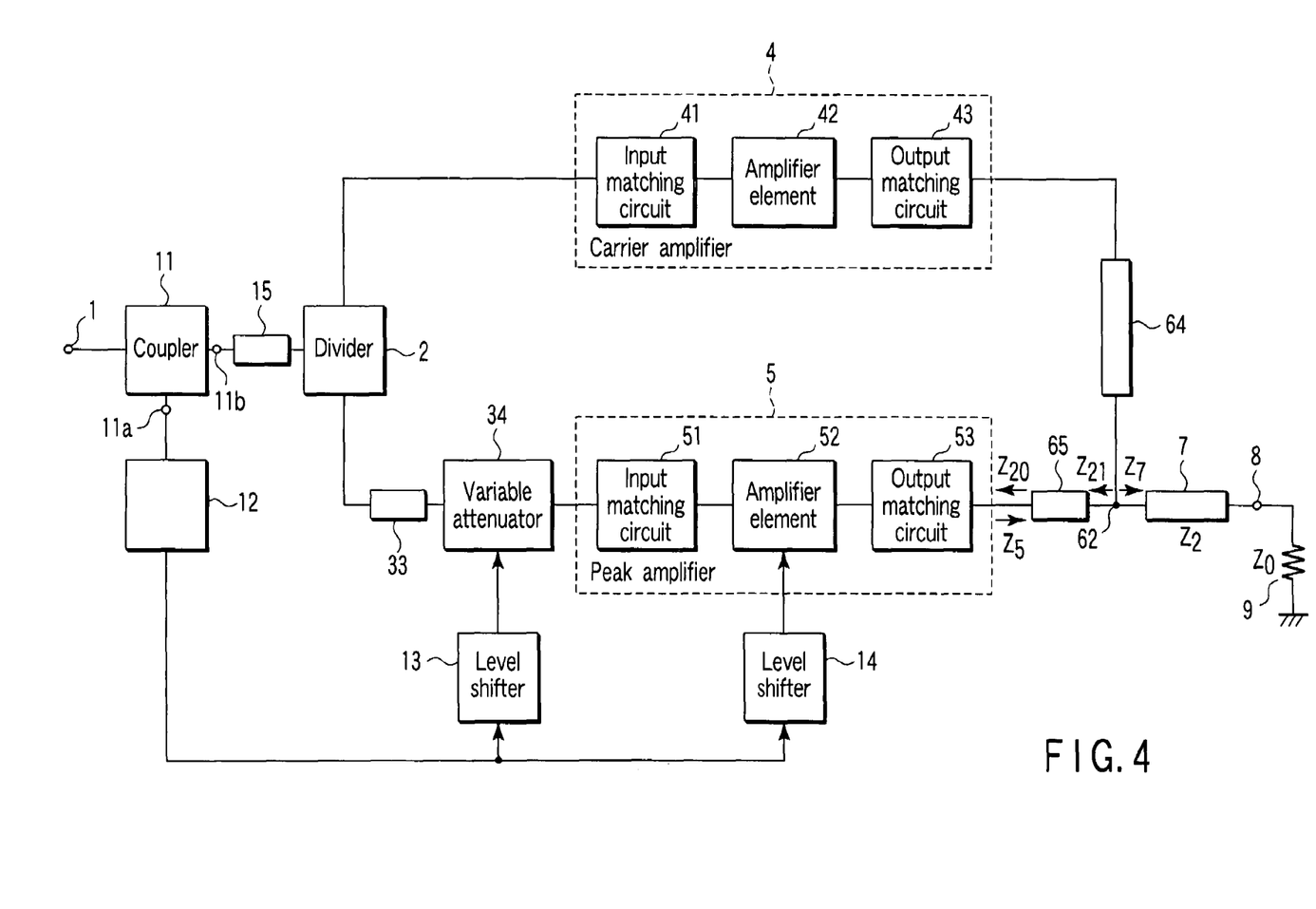
FIG. 4 is a block diagram illustrating an amplifier according to a first embodiment of the invention.

Referring to FIG. 4, in an amplifier apparatus according to a first embodiment of the invention, an input signal from a signal input terminal 1 is input to a coupler 11. The coupler 11 is, for example, a T-branch line formed on a wiring substrate, a 3-dB coupler or an unequal divider, and includes a first coupling terminal 11a and second coupling terminal 11b. The first coupling terminal 11a is connected to the input terminal of a level sensor 12, and the second coupling terminal 11b is connected to the input terminal of a delay line 15. The level sensor 12 is, for example, a wave detector. The output terminal of the delay line 15 is connected to the input terminal of a divider 2.

One output terminal of the divider 2 is connected to the input terminal of a carrier amplifier 4 that comprises an input matching circuit 41, amplifier element 42 and output matching circuit 43. The other output terminal of the divider 2 is connected to the input terminal of a variable attenuator 34 via a phase shifter 33. The output terminal of the variable attenuator 34 is connected to the input terminal of a peak amplifier 5 that comprises an input matching circuit 51, amplifier element 52 and output matching circuit 53.

The output signal of the level sensor 12 is input to the control terminal of the variable attenuator 34 via a level shifter 13.

The output terminal of the carrier amplifier 4 is connected to a node 62 via an impedance transformer 64. The output terminal of the peak amplifier 5 is connected to the node 62 via an impedance transformer 65. The node 62 is connected to a signal output terminal 8 via a λ/4 transformer 7, and the load 9 is also connected to the signal output terminal 8.

The signal input terminal 1 receives an input signal from a pre-stage circuit (not shown). The input signal is guided to the first and second coupling terminals 11a and 11b via the coupler 11. The signal from the first coupling terminal 11a is input to the level sensor 12. The input signal level sensed by the level sensor 12 is input to the level shifters 13 and 14.

Further, the signal from the second coupling terminal 11b of the coupler 11 is input to the divider 2 via the delay line 15. The delay line 15 is provided for delaying the input signal to make the time of the application of a control voltage to the variable attenuator 34 and peak amplifier 5 coincide with the time of the supply of the input signal to the variable attenuator 34 and peak amplifier 5. The divider 2 is, for example, a T-branch line formed on a wiring substrate, a 3-dB coupler or an unequal divider, and divides the input signal.

One signal output from the divider 2 is input to the carrier amplifier 4, where it is amplified.

As described above, the carrier amplifier 4 comprises the input matching circuit 41, amplifier element 42 and output matching circuit 43. The input matching circuit 41 performs impedance matching concerning the input impedance of the amplifier element 42. The input signal of the carrier amplifier 4 is output to the amplifier element 42 via the input matching circuit 41. The amplifier element 42 amplifies the signal with a preset gain. The output matching circuit 43 performs impedance matching concerning the output impedance of the amplifier element 42. The signal amplified by the amplifier element 42 is input to the impedance transformer 64 via the output matching circuit 43.

The other signal output from the divider 2 is input to the peak amplifier 5 via the phase shifter 33 and variable attenuator 34.

The phase shifter 33 is basically a transmission line for generating the delay acquired by subtracting the delay corresponding to the impedance transformer 65 from the delay corresponding to the impedance transformer 64. The phase shifter 33 performs in-phase Doherty synthesis. To this end, the phase shifter 33 also must absorb the phase difference between the carrier amplifier 4 and the combination of the peak amplifier 5 and variable attenuator 34. Therefore, there is a case where the phase shifter 33 is contained in the carrier amplifier 4.

The variable attenuator 34 receives an attenuation amount adjustment signal from the level sensor 12 via the level shifter 13. The attenuation amount adjustment signal designates the attenuation amount of the variable attenuator 34 to adjust the gain of the peak amplifier 5 that increases in accordance with an increase in the input signal level. The variable attenuator 34 attenuates the signal, output from the phase shifter 33, in accordance with the attenuation amount adjustment signal, and outputs the resultant signal to the peak amplifier 5. As described above, the peak amplifier 5 comprises the input matching circuit 51, amplifier element 52 and output matching circuit 53.

The input matching circuit 51 performs impedance matching concerning the input impedance of the amplifier element 52. The input signal of the peak amplifier 5 is output to the amplifier element 52 via the input matching circuit 51. The output of the level sensor 12 is also input as a bias signal to the amplifier element 52 via the level shifter 14. In accordance with an increase/decrease in the level of the bias signal, the amplifier element 52 is biased between class AB and class C, and amplifies the input signal of the peak amplifier 5. If the input signal level is lower than a preset first threshold value, the amplifier element 52 operates as a class C amplifier. In contrast, if the input signal level is higher than a preset second threshold value that is higher than the first threshold value, the amplifier element 52 operates as a class AB amplifier with substantially the same conduction angle as the amplifier element 42. Further, if the input signal level is not less than the first threshold value and not more than the second threshold value, the amplifier element 52 operates as a class AB amplifier with a conduction angle narrower than the above-mentioned one.

Output matching circuit 53 performs impedance matching concerning the output impedance of the amplifier element 52. The load impedance of the output matching circuit 53 is infinite in range A, and $Z_5$ in range C. The signal amplified by the amplifier element 52 is input to the impedance transformer 65 via the output matching circuit 53.

In general, the amplifier elements 42 and 52 are formed of a semiconductor device, such as a lateral double-diffused MOS (LD-MOS), GaAs FET, high electron mobility transistor (HEMT) or heterojunction bipolar transistor (HBT). The input matching circuits 41 and 51 and output matching circuits 43 and 53 are formed of a known concentrated constant circuit or distributed constant circuit, or their combination. The output matching circuits 43 and 53 may incorporate a stray capacitance, stray inductance or the like, which is inevitable for mounting.

The output matching circuit 43 is designed to perform matching under such a good condition that, for example, if the input signal level is high, the maximum output or large gain can be acquired.

The impedance transformer 64, which performs impedance transformation, is formed of a transmission line having an arbitrary electric length l of 0 to $\lambda/2$ or more (which is not limited to an odd number of multiples of $\lambda/4$), and has a characteristic impedance $Z_1$ equal to $2Z_7=2Z_2^2/Z_0$. The electric length is set so that when, for example, the input signal level is low, the output matching circuit 43 can perform matching under better conditions concerning distortion and efficiency, etc. Accordingly, even if the input signal level is varied, the load impedance of the output matching circuit 43 can be shifted along the better matching conditions.

The signals amplified by the carrier amplifier 4 and peak amplifier 5 are combined at the node 62 via the impedance transformers 64 and 65, respectively.

The impedance transformer 65 is formed of a transmission line having an arbitrary electric length l of 0 to $\lambda/2$ or more, and performs impedance transformation. More specifically, the impedance transformer 65 transforms output impedance $Z_{20}$ into impedance $Z_{21}$ higher than the former in range A in which the peak amplifier 5 does not operate.

The node 62 is designed such that it is directly connected on the printed board to the outputs of the carrier and peak amplifiers 4 and 5 when the electric length of the impedance transformers 64 and 65 is $0\lambda$.

The signal combined at the node 62 is supplied to the load 9 via the $\lambda/4$ transformer 7 and output terminal 8. The $\lambda/4$ transformer 7 transforms, into output load $Z_0$, impedance $Z_7$ seen from the node 62. The $\lambda/4$ transformer 7 has a characteristic impedance of $Z_2$. The $\lambda/4$ transformer 7 may be formed on a wiring substrate as a conductive pattern having a line width corresponding to characteristic impedance $Z_2$ and a length corresponding to $\lambda/4$. If the $\lambda/4$ transformer 7 is made to have a cascade structure, it can perform impedance matching in a wider frequency range. Further, if desired matching can be realized, matching means other than the $\lambda/4$ transformer 7 may be used.

In the amplifier apparatus constructed as the above, the signal input to the input terminal 1 is guided to the coupler 11. From the coupler 11, signals are output to the first and second coupling terminals 11a and 11b. The signal output from the first coupling terminal 11a is sensed by the level sensor 12, then converted into a signal of a required voltage by the level shifters 13 and 14, and supplied to the control terminal of the variable attenuator 34 and the control terminal of the amplifier element 52 of the peak amplifier 5. The amount of attenuation in the variable attenuator 34 is controlled by the signal supplied from the level shifter 13, while the operation of the amplifier element 52 is controlled by the bias signal supplied from the level shifter 14.

On the other hand, the signal output from the second coupling terminal 11b of the coupler 11 is input to the divider 2 via the delay line 15, where it is divided into two signals. One of the signals from the divider 2 is amplified by the carrier amplifier 4. The carrier amplifier 4 always operates as a class AB amplifier, regardless of the input signal level.

The other signal from the divider 2 has its phase adjusted by the phase shifter 33, and has its amplitude adjusted by the variable attenuator 34. The resultant signal is input to the peak amplifier 5. The peak amplifier 5 operates as a class C amplifier or class AB amplifier in accordance with the bias voltage applied by the level shifter 14.

Figure 5:
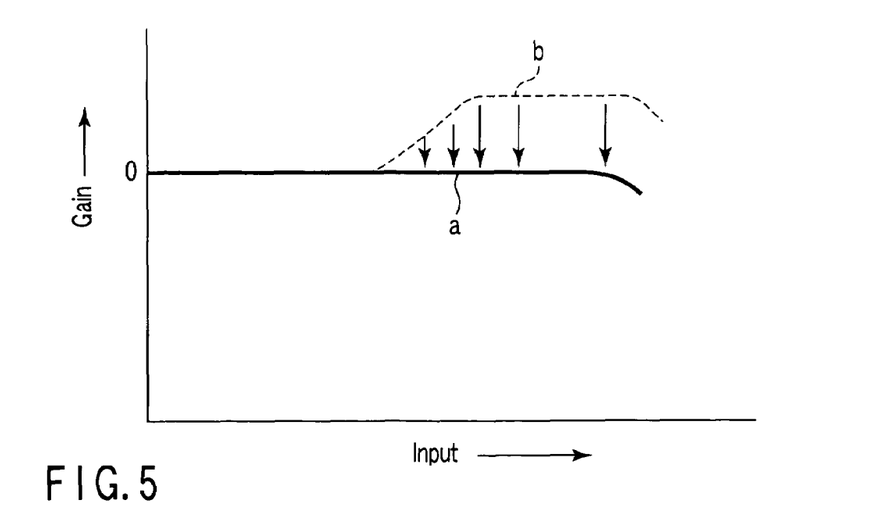
FIG. 5 is a view illustrating the AM-AM characteristic of the first embodiment.

As can be understood from the AM-AM characteristic shown in FIG. 5, the amplifier apparatus of the first embodiment provides substantially a flat gain characteristic with significantly reduced distortion. In FIG. 5, solid line a indicates the characteristic acquired when bias control is performed on the amplifier element 52 and signal level control is performed by the variable attenuator 34, while broken line b indicates the characteristic acquired when only bias control is performed on the amplifier element 52.

Further, the AM-PM characteristic of the amplifier apparatus is improved in the same way as the above-described AM-AM characteristic, which provides a flat AM-PM characteristic. This is because when the peak amplifier 5 performs amplification in the range of class AB, the AM-PM distortion due to the peak amplifier 5 is reduced. Further, there is a case where the offset of distortion can be expected between the carrier and peak amplifiers 4 and 5.

In the first embodiment, the signal input to the input terminal 1 is firstly guided to the coupler 11 and then to the level sensor 12, where the level of the input signal is sensed. Alternatively, the input current, for example, of the carrier amplifier 4, which is equivalent to the input signal level, may be sensed.

Second Embodiment

Figure 6:
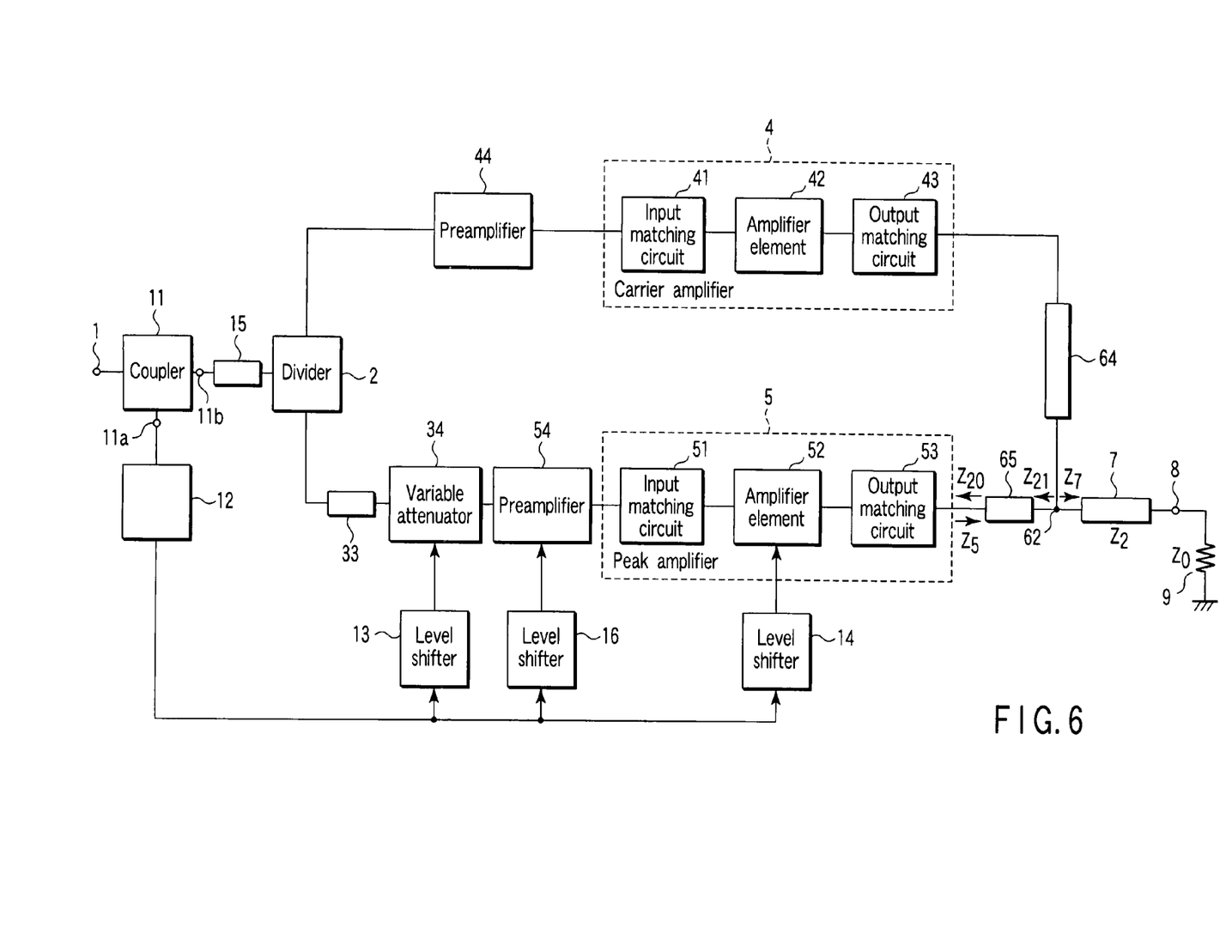
FIG. 6 is a block diagram illustrating an amplifier according to a second embodiment of the invention.

Referring to FIG. 6, an amplifier apparatus according to a second embodiment will be described. As shown in FIG. 6, the amplifier apparatus of the second embodiment is acquired by adding, to the apparatus of the first embodiment, a level shifter 16 provided between the level sensor 12 and preamplifier 54, a preamplifier 44 that is provided at the input side of the carrier amplifier 4 and operates as a class AB amplifier, and a preamplifier 54 provided at the input side of the peak amplifier 5. The signal sensed by the level sensor 12 is converted into a bias voltage by the level shifter 16, and input to the control terminal of the preamplifier 54. The bias voltage controls the preamplifier 54 to shift from class C to class AB. The other elements of the second embodiment are similar to those of the first embodiment. They are denoted by corresponding reference numerals, and are not described in detail.

The level shifter 16 performs bias control on the preamplifier 54 to shift it from class C to class AB in accordance with the input signal level, like the peak amplifier 5. Namely, the preamplifier 54 is biased to class C if the input signal level is lower than a preset first threshold value, biased to class AB with substantially the same conduction angle as the preamplifier 44 if the input signal level is higher than a preset second threshold value that is higher than the first threshold value, and biased to class AB with a conduction angle narrower than the above-mentioned one if the input signal level is not less than the first threshold value and not more than the second threshold value. Further, the increase in gain caused by setting the preamplifier 54 and peak amplifier 5 to class AB is attenuated by the variable attenuator 34, thereby providing amplification characteristic of high linearity and little distortion.

As described above, the insertion of the preamplifiers 44 and 54 can reduce the power consumption of the variable attenuator 34, and reduce the loss at the divider 2, thereby realizing higher efficiency.

In the second embodiment, each of the preamplifiers 44 and 54 may be formed of a multi-stage structure. If each of the preamplifiers 44 and 54 is formed of a multi-stage structure, the delay line 15 can be shortened. Alternatively, the preamplifier 54 may be formed as a class AB amplifier of a fixed bias.

Third Embodiment

Figure 7:
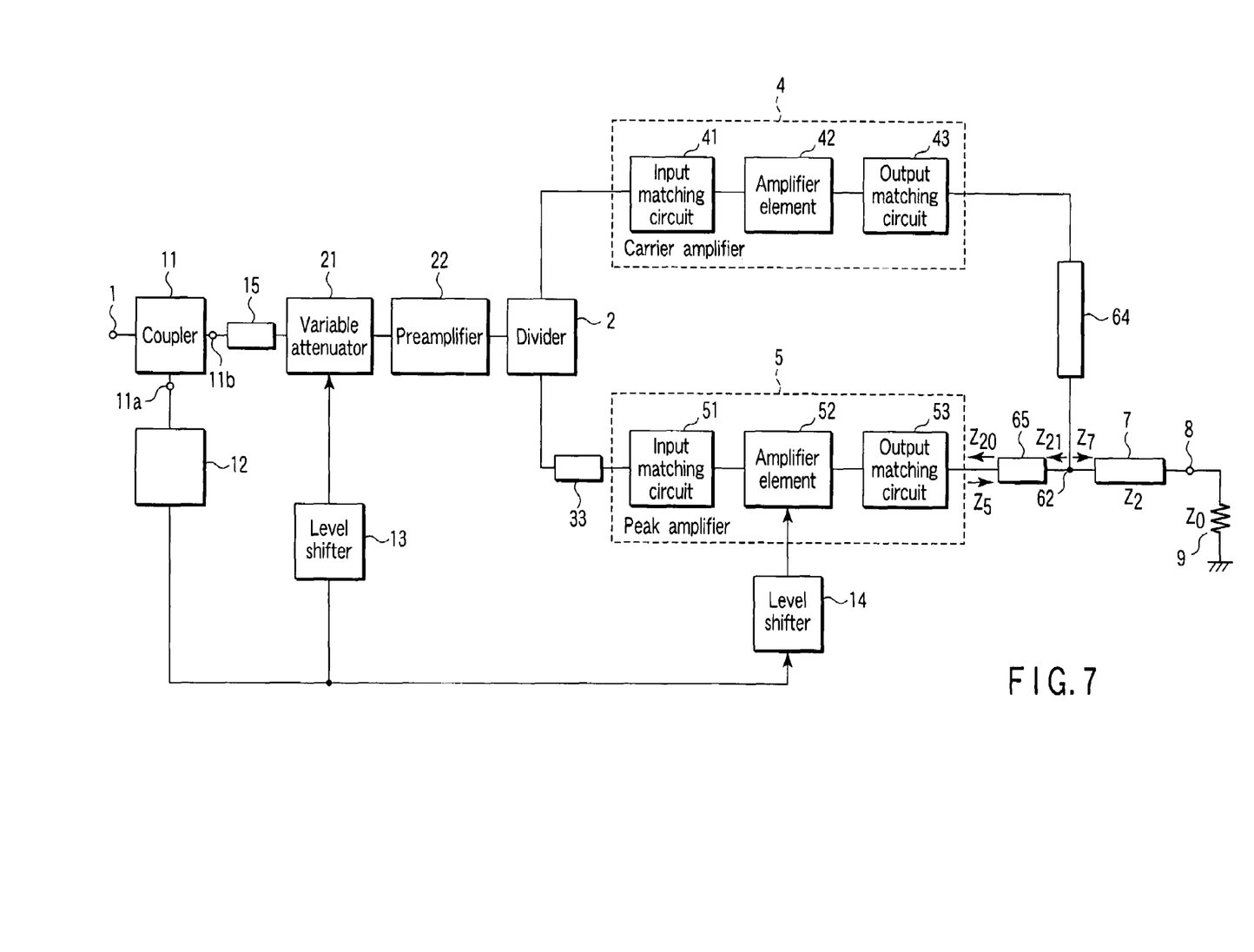
FIG. 7 is a block diagram illustrating an amplifier according to a third embodiment of the invention.

Referring then to FIG. 7, an amplifier apparatus according to a third embodiment will be described.

As shown in FIG. 7, the third embodiment is acquired by inserting a variable attenuator 21 and a preamplifier 22, which operates as a class AB amplifier, between the delay line 15 and divider 2 of the first embodiment. Further, the signal sensed by the level sensor 12 is converted into a control voltage by the level shifter 13 and then input to the variable attenuator 21. Furthermore, the third embodiment employs no element corresponding to the variable attenuator 34 in the first embodiment. Since the other elements of the third embodiment are similar to those of the first embodiment, they are denoted by corresponding reference numerals, and are not described in detail.

The signal input to the input terminal 1 is guided to the coupler 11. From the coupler 11, signals are output to the first and second coupling terminals 11a and 11b. The signal output from the second coupling terminal 11b is input to the preamplifier 22 via the delay line 15 and variable attenuator 21, and amplified by the preamplifier 22. The signal amplified by the preamplifier 22 is divided into two signals by the divider 2. One of the two signals is input to the carrier amplifier 4 as a class AB amplifier, where it is amplified. The other signal of the divider 2 is input to the peak amplifier 5 via the phase shifter 33, where it is amplified in the operation mode corresponding to the input signal level.

On the other hand, the signal output from the first coupling terminal 11a of the coupler 11 is sensed by the level sensor 12, then converted into a signal of a required voltage by the level shifters 13 and 14, and input to the variable attenuator 21 and amplifier element 52. When the input signal level is increased, the level shifter 13 increases the attenuation amount of the variable attenuator 21 to correct an increase in the gain of the peak amplifier 5.

As a result, the third embodiment provides an AM-AM characteristic similar to that of FIG. 5 provided by the first embodiment. Namely, the third embodiment provides substantially a flat gain characteristic with significantly reduced distortion. Similarly, the AM-PM characteristic, not shown, of the third embodiment is improved.

Figure 8:
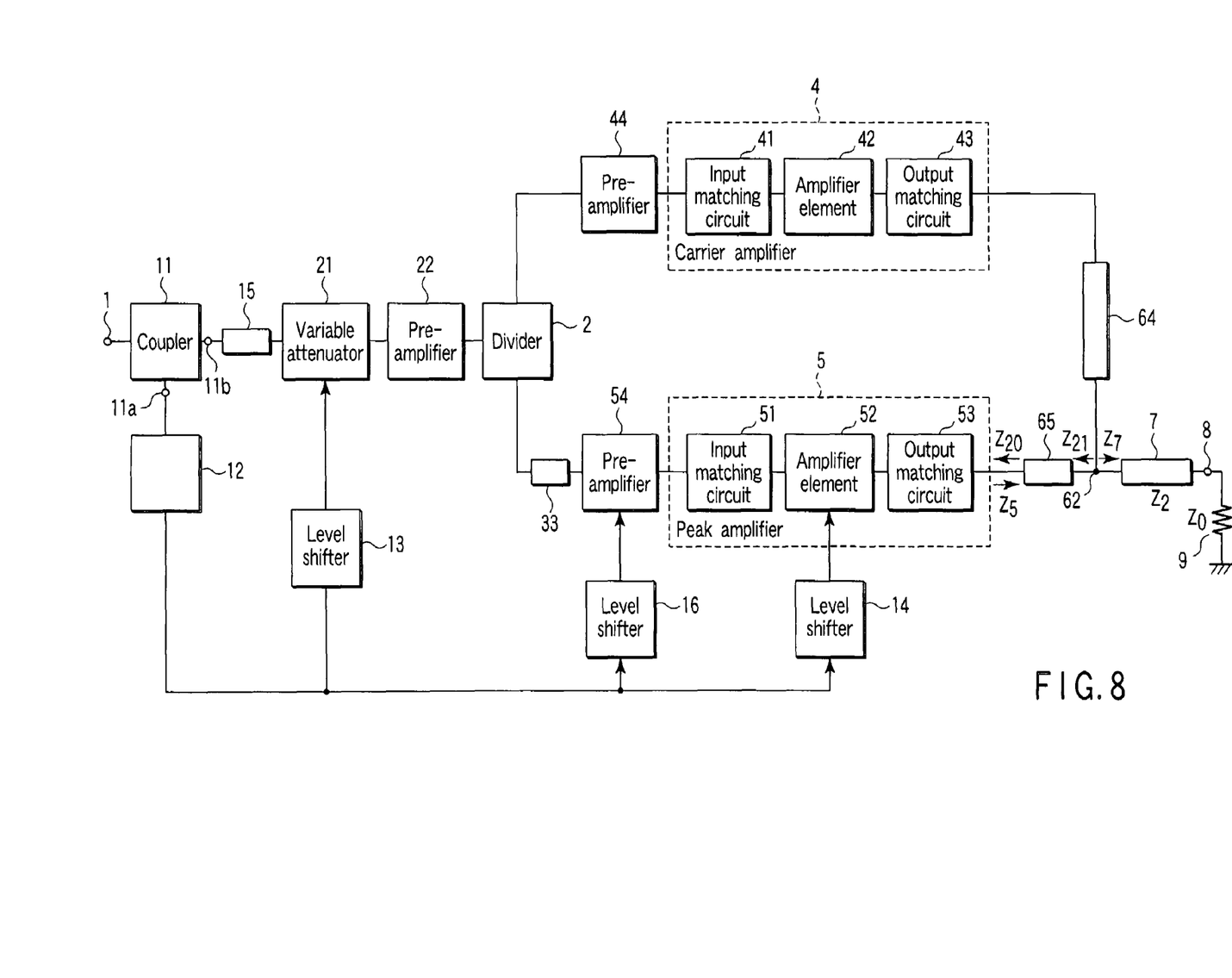
FIG. 8 is a block diagram illustrating an amplifier according to a first modification of the third embodiment of the invention.
Figure 9:
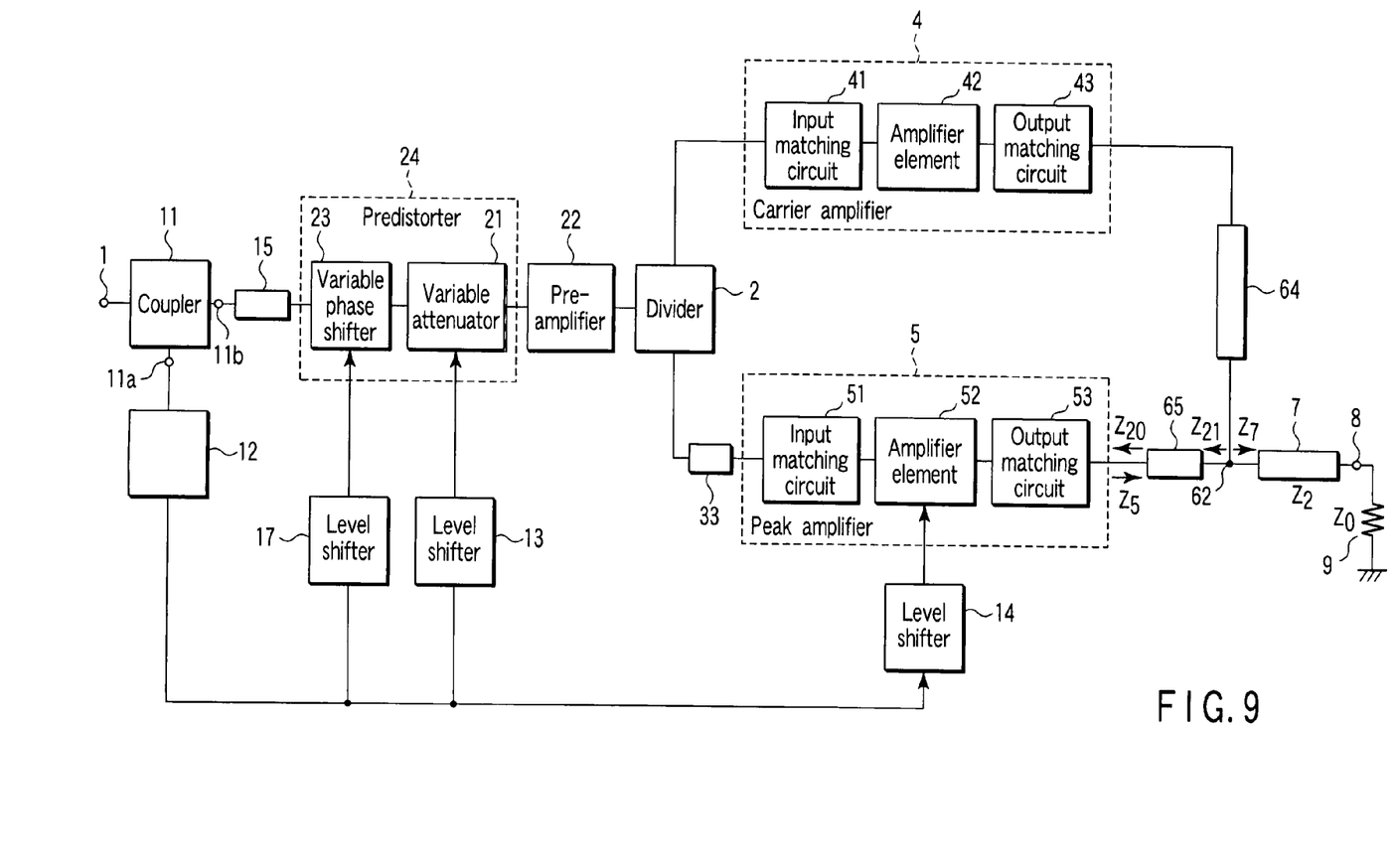
FIG. 9 is a block diagram illustrating an amplifier according to a second modification of the third embodiment of the invention.

The insertion of the preamplifier 22 before the divider 2 as shown in FIG. 7 enables an input signal of a further lower level to be processed. The preamplifier 22 may be formed of a multi-stage structure. Further, the preamplifier 22 may include a frequency conversion unit or band limit filter. In this case, the input signal is an intermediate frequency (IF) signal, which increases the degree of freedom in designing the amplifier apparatus. Further, as shown in FIG. 8, preamplifiers 44 and 54 may be provided before the carrier amplifier 4 and peak amplifier 5, respectively. The insertion of the preamplifiers 44 and 54 can shorten the delay line 15. Yet further, as shown in FIG. 9, an analog pre-distorter 24 may be employed, which is formed of the variable attenuator 21, a variable phase shifter 23 provided before or after the variable attenuator 21, and a level shifter 17 connected to the phase shifter 23. In this case, the variable attenuator 21 and phase shifter 23 are controlled by the level shifters 13 and 17, respectively, in accordance with the input signal level.

Fourth Embodiment

Figure 10:
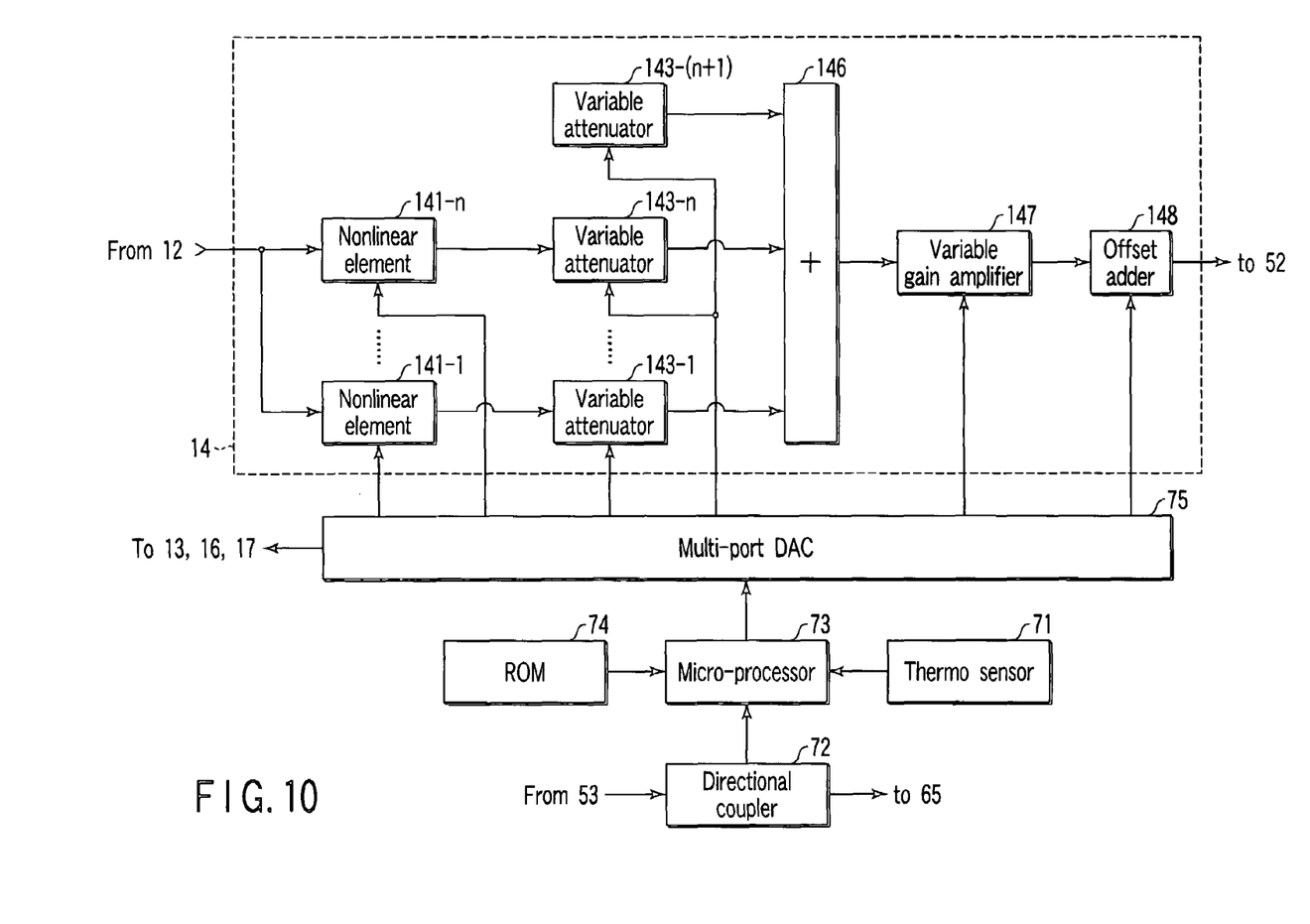
FIG. 10 is a block diagram illustrating part of an amplifier according to a fourth embodiment of the invention.
Figure 11:
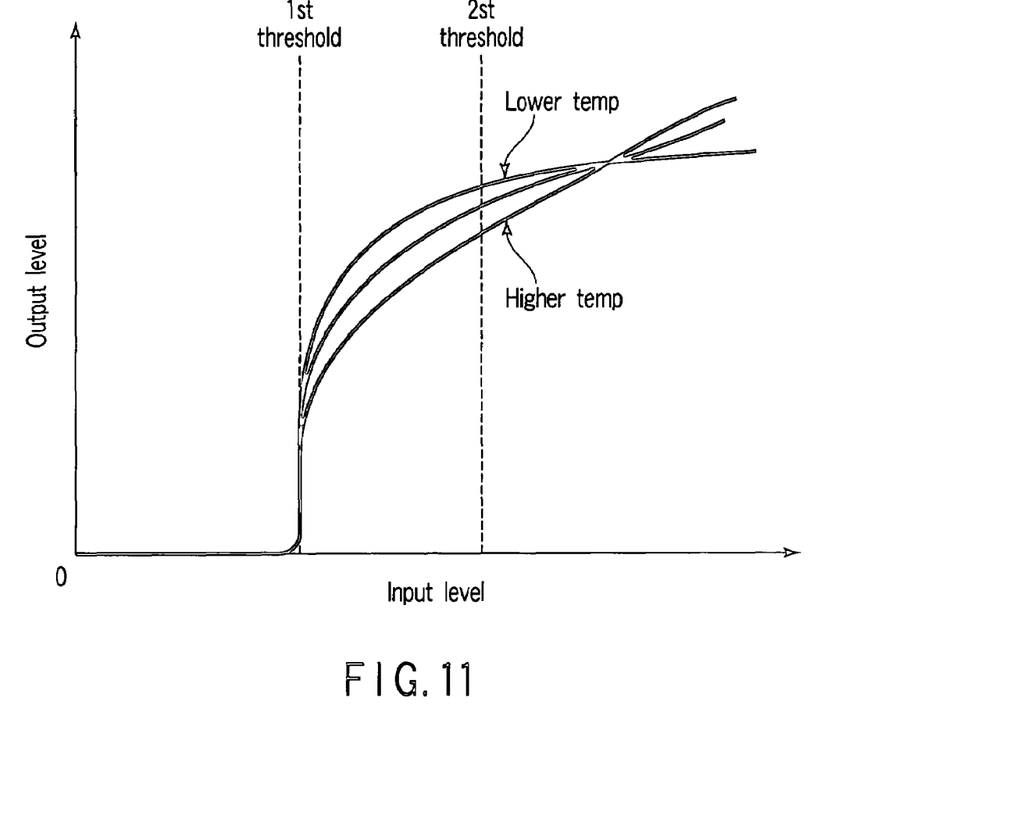
FIG. 11 is a graph illustrating examples of bias curves generated by the level shifter 14 appearing in FIG. 10.

Referring to FIGS. 10 and 11, an amplifier apparatus according to a fourth embodiment of the invention will be described.

FIG. 10 shows only the internal configuration of a level shifter 14 as a level shifter example employed in the fourth embodiment. The level shifter 14 is equivalent to the level shifters 13, 14 and 16 employed in the first to third embodiments. Namely, the fourth embodiment is acquired by replacing each of the level shifters 13, 14 and 16 of the first to third embodiments with the level shifter of FIG. 10.

As shown in FIG. 10, the level shifter 14 of the fourth embodiment comprises n (n: a natural number) nonlinear elements 141-1 to 141-n, (n+1) variable attenuators 143-1 to 143-(n+1), combiner 146, variable gain amplifier 147 and offset adder 148.

A multi-port digital-to-analog converter (DAC) 75 applies respective biases to the nonlinear elements 141-1 to 141-n. The nonlinear elements 141-1 to 141-n, in turn, convert the level signal, supplied from the level sensor 12, into different level signals using their respective nonlinear characteristics, and output them to the variable attenuators 143-1 to 143-n.

The variable attenuators 143-1 to 143-n attenuate the level signals supplied from the nonlinear elements 141-1 to 141-n, using their respective attenuation amounts designated by the multi-port DAC 75, and output the resultant signals to the combiner 146. The variable attenuator 143-(n+1) attenuates the level signal supplied from the level sensor 12, using the attenuation amount designated by the multi-port DAC 75, and output the resultant signal to the combiner 146.

The combiner 146 combines the output signals of the variable attenuators 143-1 to 143-(n+1), and outputs the resultant signal to the variable gain amplifier 147.

The variable gain amplifier 147 amplifies the signal supplied from the combiner 146, using a preset gain, and outputs it to the offset adder 148.

The offset adder 148 adds a preset direct-current offset signal to the signal supplied from the variable gain amplifier 147, and outputs it to the control terminal of the amplifier element 52.

The respective biases applied to the nonlinear elements 141-1 to 141-n, the respective attenuation amounts used by the variable attenuators 143-1 to 143-(n+1), the gain of the variable gain amplifier 147 and the direct-current offset signal used by the offset adder 148, etc., are defined as parameters used by the level shifter 14. The characteristics of the level shifter 14 are uniquely determined by the parameters and held semi-fixedly.

A thermo sensor 71 is thermally coupled to the amplifier element 52, and is used to detect the temperature of the amplifier element 52 and output the detection result to a microprocessor 73.

A directional coupler 72 is interposed between, for example, the peak amplifier 5 and impedance transformer 65. The directional coupler 72 detects reflection coefficient Γ (or the standing wave ratio [SWR] and phase) of the peak amplifier 5 acquired when the load 9 is seen from the peak amplifier 5, and outputs the detection result to the microprocessor 73. Alternatively, the directional coupler 72 may be provided at an arbitrary position between the amplifier element 52 and output terminal 8. Further, for example, the directional coupler 72 and λ/4 transformer 7 may have a structure in common.

Based on the temperature and reflection coefficient Γ detected by the thermo sensor 71 and directional coupler 72, the microprocessor 73 computes the parameters of the level shifters 14, using, for example, tables stored in a ROM 74 or primary approximation, and outputs the computation results to the multi-port DAC 75.

The ROM 74 stores a program for operating the microprocessor 73, and the above-mentioned tables or coefficients for approximation.

The multi-port DAC 75 receives the parameter data of the level shifter 14 computed by the microprocessor 73, subjects the parameter data to digital-to-analog conversion, and supplies the analog signals, acquired by the conversion, to the elements of the level shifter 14.

In FIG. 11, the horizontal axis indicates the input signal level, and the vertical axis indicates the bias voltage (output signal level). As can be understood from the characteristic curves, shown in FIG. 11, of the bias voltages generated by the level shifter 14 of the fourth embodiment, each bias voltage abruptly rises near a first threshold value, increases sharply between the first threshold value and a second threshold value higher than the former, and continues to increase gently after the second threshold value. Further, the characteristic curves vary in accordance with the temperature of the amplifier element 52.

The ROM 74 stores at least one set of parameters (standard values) of the level shifter 14 necessary to determine a bias curve. After the parameters for the level shifter 14 are supplied to the level shifter 14, an arbitrary characteristic as shown in FIG. 11 is combined.

In, for example, an LD-MOS, the drain current $I_D$ is given by $I_D = K(V_{gs} - V_{th})^2$. However, reflection gain coefficient K and threshold value $V_{th}$ depend upon temperature. Therefore, in accordance with the temperature of the amplifier element 52, bias $V_{gs}$, at which a desired drain current flows, varies. If bias $V_{gs}$ is subjected to temperature compensation, the gain varies simultaneously.

Further, in the case of a base station using an adaptive array antenna, or when a mobile terminal that may be gripped near the antenna by user does not use an isolator, a change in the impedance of the antenna appears as a change in the load impedance of the amplifier. When the load impedance of the amplifier varies, the gain or phase of the amplifier inevitably varies. In Doherty synthesis, the loads to be born by the carrier amplifier 4 and peak amplifier 5 depend upon the level of the input signal, and they are not always equal to each other. Accordingly, a change in the load impedance of the amplifier apparatus influences the carrier amplifier 4 and peak amplifier 5 in different ways, which changes the Doherty synthesis conditions to thereby change the distortion of the amplifier apparatus intricately. Such problems inevitably occur even due to variations in the characteristics of the amplifier elements or the other circuit components, or their secular variations. For instance, the dielectric constant of the substrate is significantly varied by moisture absorption.

In light of the above, the microprocessor 73 controls the characteristics of the level shifter 14 to compensate for the dependence of the non-linearity (in particular, the AM-PM characteristic) of the peak amplifier 5 upon temperature, based on the detected temperature of the amplifier element 52. Similarly, the microprocessor 73 controls the characteristics of the level shifter 14 (and level shifter 16) to compensate for the dependence of the gain (AM-AM characteristic) of the peak amplifier 5 upon temperature. Further, the microprocessor 73 controls the characteristics of the level shifter 14 to compensate for the dependence of the non-linearity of the peak amplifier 5 upon reflection coefficient, based on the detected reflection coefficient average value. Similarly, the microprocessor 73 controls the characteristics of the level shifter 14 (and level shifter 16) to compensate for the dependence of the gain of the peak amplifier 5 upon reflection coefficient.

The above-mentioned control is performed at a relatively slow pace corresponding to a change in temperature or load. Further, the above-mentioned control can be realized by a known method of pre-measuring temperature-dependence and reflection-coefficient-dependence characteristics, storing, in the ROM 74, all parameters for compensating for them, and reading them in accordance with the detection result. However, if all sets of parameters for compensating for other characteristics, such as frequency-dependence characteristic, as well as the temperature-dependence and reflection-coefficient-dependence characteristics, are stored in a table, the capacity of the table becomes too enormous. Therefore, in the fourth embodiment, at least one of the temperature-dependence and reflection-coefficient-dependence characteristics is compensated for by primary approximation. Namely, one parameter is expressed as a primary function related to the detected temperature. Such a primary function is acquired using a standard bias corresponding to a reference temperature or reflection-coefficient, and a proportionality constant corresponding to temperature or reflection coefficient. If the reflection coefficient is a complex number, respective proportionality constants corresponding to the real part and imaginary part of the complex number may be used.

In the above description, the AM-PM characteristic is mainly compensated for by bias control, while the AM-AM characteristic is mainly compensated for by gain control. In actual analog elements, however, it is difficult to make, variable, only the phase or gain. In light of this, it would be advisable to consider that both the AM-PM characteristic and AM-AM characteristic are compensated for by the combination of the amount of attenuation set for the variable attenuator, and the bias applied to the amplifier element 52.

In the fourth embodiment, even if the non-linear distortion of the peak amplifier 5 varies, the variation can be compensated for highly accurately, with the amplification operation of the peak amplifier 5 set in class AB range. Accordingly, an amplifier apparatus of little distortion can be acquired.

Although in the above-described embodiments, all components are assumed to perform analog operations, the coupler 11, level sensor 12, level shifters 13 and 14, delay line 15 and variable attenuator 21, the operations of which can be processed digitally, do not always have to be analog circuits. For instance, when the amplifier apparatuses of the first to fourth embodiments are each combined with a digital pre-distortion (DPD) device, the level sensor 12 and variable attenuator 21 can be replaced with corresponding functions employed in the DPD device. Further, instead of using the level shifters 13, 14 and 16, an arbitrary voltage applied by the DPD device may be subjected to digital-to-analog conversion, and the resultant voltage be supplied.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An amplifier apparatus comprising:
   an input terminal to receive an input signal to be amplified;
   a divider to divide the input signal into a first divided signal and a second divided signal;
   a carrier amplifier to amplify the first divided signal by operating as a class AB with a first conduction angle and produce a first amplified signal;
   a variable attenuator to attenuate the second divided signal in accordance with a variable attenuation amount;
   a peak amplifier to amplify the second divided signal attenuated by the variable attenuator to produce a second amplified signal;

a first control unit configured to control a bias applied to the peak amplifier to (a) make the peak amplifier operate as a class C when a level of the input signal is lower than a first threshold value, to (b) make the peak amplifier operate as the class AB with a second conduction angle substantially equal to the first conduction angle, when the level of the input signal is higher than a second threshold value higher than the first threshold value, and to (c) make the peak amplifier operate as the class AB with a third conduction angle smaller than the first conduction angle, when the level of the input signal is not less than the first threshold value and not more than the second threshold value;

a second control unit configured to control the variable attenuator for increasing the attenuation amount in accordance with an increase in the level of the input signal;

a combiner to combine the first amplified signal and the second amplified signal and produce an amplified output signal; and a signal output terminal to output the amplified output signal.

2. The amplifier apparatus according to claim 1, further comprising:

a storage unit to store parameters indicating correspondence between the level of the input signal and the bias; and a correction unit configured to periodically correct the parameters, based on temperature of the peak amplifier and a reflection coefficient of a load on the peak amplifier, and wherein the first control unit is configured to control the bias in accordance with the corrected parameters.

3. The amplifier apparatus according to claim 2, wherein the correction unit is configured to correct the parameters in accordance with primary approximation based on at least one of the temperature and the reflection coefficient.

4. The amplifier apparatus according to claim 1, wherein the combiner includes an output node, a first transmission line and a second transmission line, the first transmission line being interposed between the carrier amplifier and the output node, and having an electric length which permits a load impedance of the carrier amplifier to be changed in accordance with a matching condition corresponding to a change in the level of the input signal, the second transmission line being interposed between the peak amplifier and the output node, and having an electric length which permits an output impedance of the carrier amplifier seen from the output node to be increased.

5. The amplifier apparatus according to claim 4, further comprising a λ/4 transformer interposed between the output node and the signal output terminal.

6. The amplifier apparatus according to claim 1, further comprising:

a first preamplifier interposed between the divider and the carrier amplifier and operating as the class AB;

a second preamplifier interposed between the variable attenuator and the peak amplifier; and a third control unit configured to control a bias applied to the second preamplifier to (d) make the second preamplifier operate as the class C when the level of the input signal is lower than the first threshold value, to (e) make the second preamplifier operate as the class AB with the second, conduction angle when the level of the input signal is higher than the second threshold value, and to (f) make the second preamplifier operate as the class AB with the third conduction angle when the level of the input signal is not less than the first threshold value and not more than the second threshold value.

7. An amplifier apparatus comprising:

an input terminal to receive an input signal to be amplified;

a variable attenuator to attenuate the input signal in accordance with a variable attenuation amount;

a first preamplifier to amplify the input signal attenuated by the variable attenuator by operation as a class AB;

a divider to divide the signal amplified by the first preamplifier into a first divided signal and a second divided signal;

a carrier amplifier to amplify the first divided signal by operating as the class AB with a first conduction angle and produce a first amplified signal;

a peak amplifier to amplify the second divided signal attenuated by the variable attenuator and produce a second amplified signal;

a first control unit configured to control a bias applied to the peak amplifier to (a) make the peak amplifier operate as a class C when a level of the input signal is lower than a first threshold value, to (b) make the peak amplifier operate as the class AB with a second conduction angle substantially equal to the first conduction angle, when the level of the input signal is higher than a second threshold value higher than the first threshold value, and to (c) make the peak amplifier operate as the class AS with a third conduction angle smaller than the first conduction angle, when the level of the input signal is not less than the first threshold value and not more than the second threshold value;

a second control unit configured to control the variable attenuator for increasing the attenuation amount in accordance with an increase in the level of the input signal;

a combiner to combine the first amplified signal and the second amplified signal and produce an amplified output signal; and a signal output terminal to output the amplified output signal.

8. The amplifier apparatus according to claim 7, further comprising:

a storage unit configured to store parameters indicating correspondence between the level of the input signal and the bias; and a correction unit configured to periodically correct the parameters, based on temperature of the peak amplifier and a reflection coefficient of a load on the peak amplifier, and wherein the first control unit is configured to control the bias in accordance with the corrected parameters.

9. The amplifier apparatus according to claim 8, wherein the correction unit is configured to correct the parameters in accordance with primary approximation based on at least one of the temperature and the reflection coefficient.

10. The amplifier apparatus according to claim 7, wherein the combiner includes an output node, a first transmission line and a second transmission line, the first transmission line being interposed between the carrier amplifier and the output node, and having an electric length which permits a load impedance of the carrier amplifier to be changed in accordance with a matching condition corresponding to a change in the level of the input signal, the second transmission line being interposed between the peak amplifier and the output node, and having an electric length which permits an output impedance of the carrier amplifier seen from the output node to be increased.

11. The amplifier apparatus according to claim 10, further comprising a λ/4 transformer interposed between the output node and the signal output terminal.

12. The amplifier apparatus according to claim 7, further comprising:
   a second preamplifier interposed between the divider and the carrier amplifier and operating as the class AB;
   a third preamplifier interposed between the variable attenuator and the peak amplifier; and
   a third control unit configured to control a bias applied to the third preamplifier to (d) make the second preamplifier operate as the class C when the level of the input signal is lower than the first threshold value, to (e) make the third preamplifier operate as the class AB with the second conduction angle when the level of the input signal is higher than the second threshold value, and to (f) make the third preamplifier operate as the class AB with the third conduction angle when the level of the input signal is not less than the first threshold value and not more than the second threshold value.

13. The amplifier apparatus according to claim 7, further comprising a pre-distorter provided before the divider and configured to impart pre-distortion to the input signal, based on the level of the input signal.

* * * * *